United States Patent [19]

Takemae et al.

[11] Patent Number: 4,807,193
[45] Date of Patent: Feb. 21, 1989

[54] SEMICONDUCTOR MEMORY DEVICE WITH A DETECTION CIRCUIT TO DETECT WORD LINE POTENTIAL

[75] Inventors: Yoshihiro Takemae, Tokyo; Takeo Takematsu, Yokohama; Kimiaki Sato, Tokyo; Takashi Horii, Yokohama; Nobumi Kodama; Makoto Yanagisawa, both of Kawasaki; Yasuhiro Takada, Yokohama, all of Japan

[73] Assignee: Fujitsu Limited, Kanagawa, Japan

[21] Appl. No.: 81,559

[22] Filed: Feb. 25, 1987

[30] Foreign Application Priority Data

Feb. 28, 1986 [JP] Japan ................... 61-043084

[51] Int. Cl.[4] .............. G11C 7/00; G11C 8/00
[52] U.S. Cl. .................... 365/205; 365/189; 365/233
[58] Field of Search ........... 365/203, 205, 207–208, 365/189, 201, 233; 307/530

[56] References Cited

U.S. PATENT DOCUMENTS

| | | | |
|---|---|---|---|
| 4,363,111 | 12/1982 | Heightley et al. | 365/205 |
| 4,393,475 | 7/1983 | Kitagawa et al. | 365/207 |
| 4,504,748 | 3/1985 | Ontami | 307/530 X |

FOREIGN PATENT DOCUMENTS 0566072  2/1981  Japan ................... 365/149

Primary Examiner—Stuart N. Hecker
Assistant Examiner—Alfonso Garcia
Attorney, Agent, or Firm—Armstrong, Nikaido, Marmelstein & Kubovcik

[57] ABSTRACT

A one-transistor one-capacitor type semiconductor memory device having a detection circuit for detecting the electric potential of a word line, to determine an appropriate timing for driving a sense amplifier, thereby improving the speed of memory operations.

7 Claims, 6 Drawing Sheets

SEMICONDUCTOR MEMORY DEVICE WITH A DETECTION CIRCUIT TO DETECT WORD LINE POTENTIAL

BACKGROUND OF THE INVENTION

(1) Field of the Invention

The present invention relates to a semiconductor memory device, and more particularly, to an improvement of a semiconductor memory device using one-transistor one-capacitor type memory cells.

(2) Description of the Related Art

A semiconductor memory device constructed by one-transistor one-capacitor type memory cells is well known and is described in, for example, Japanese Patent Publication No. 56-6072 published in Japan on Feb. 9, 1981.

In a one-transistor one-capacitor type semiconductor memory device, each memory cell is connected between a word line and one of a pair of bit lines. The memory cell is constructed by one transistor functioning as a transfer gate and one capacitor for storing data.

Accompanying the increase in integration density, the width of the word line, usually formed by aluminum having a small resistivity, has become narrower, resulting in a large wiring resistance, and if the word line is formed by the polysilicon, which has a larger resistivity than aluminum, the wiring resistance will become even larger. Further, the wiring resistance is not constant in all semiconductor memory devices but varies depending on the manufacturing processes of the devices.

Each word line is driven by a word decoder, and a number of memory cells are connected to the word line. By driving the word line, charges stored in each memory cell connected to the word line flow out on the corresponding bit line. A sense amplifier is then activated to amplify the potential difference between a pair of bit lines.

Because of the wiring resistance of the word line as mentioned above, the timing at which the sense amplifier is activated must be delayed sufficiently to ensure the amplification of the data actually flowing from the memory cell to the bit line.

In a conventional one-transistor one-capacitor type semiconductor memory device, the activation timing of the sense amplifier is determined by an estimated delay time. The estimated delay time is determined by estimating the longest delay time among all of the word lines in a number of semiconductor memory devices, taking into account the variations occurring due to the manufacturing processes or the large wiring resistance. Therefore, the conventional semiconductor memory device has a disadvantage in that, even after the potential at the point on the word line farthest from the word decoder rises sufficiently to open the transfer gate transistor in the memory cell connected to that point, the sense amplifier is not activated until the estimated delay time has lapsed. If the estimated delay time is too long, the reading timing is also delayed too much.

SUMMARY OF THE INVENTION

To solve the above problem, an object of the present invention is to improve the access time of a semiconductor memory device by providing a detection circuit for detecting the electric potential on a word line.

To attain the above object, there is provided, according to the present invention, a semiconductor memory device having a word line, a pair of bit lines, a one-transistor one-capacitor type memory cell connected between the word line and one of the pair of bit lines and a sense amplifier connected between the pair of bit lines. The semiconductor memory device comprises a detection circuit, for detecting that an electric potential at the longest rise time point on the word line exceeds a precharge potential of the bit line plus a threshold voltage of a transistor in the memory cell. The potential rise time at that point is the longest at any point on the word line, and the sense amplifier is driven by a detection signal output from the detection circuit.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

For a better understanding of the embodiments of the present invention, a conventional semiconductor memory device will be first described with reference to FIGS. 8A to 10.

Figure 8A:
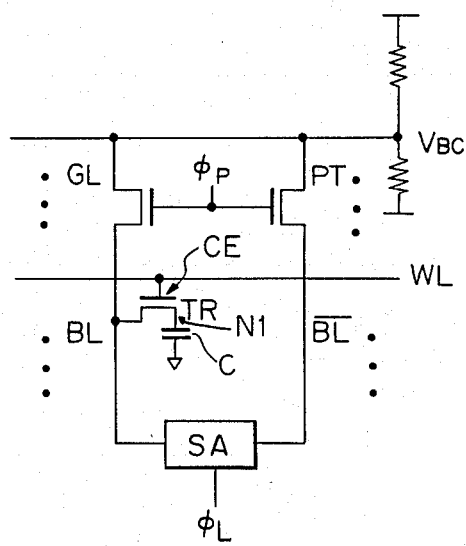
FIG. 8A is a circuit diagram showing a conventional semiconductor memory device.

FIG. 8A shows a conventional one-transistor one-capacitor type memory cell structure. FIG. 8A represents one memory cell and a peripheral circuit thereof of a folded bit line construction, in which a pair of bit lines BL and $\overline{BL}$ are folded with respect to a sense amplifier SA, and a word line WL runs perpendicular to the bit lines. A memory cell CE is provided between the word line WL and the bit line BL. In FIG. 8A, only a single memory cell CE is illustrated, to simplify the drawing, but in practice, a number of memory cells CE are provided at every other cross point between the bit lines and the word lines. The memory cell CE is constructed by a MOS capacitor C and a MOS transistor TR. The data logic depends on whether there are charges in a MOS capacitor C of the memory cell CE. The memory cell CE does not have an amplification function, and the MOS transistor TR functions simply as a gate. In a memory cell operation, reading out data, writing data, or refreshing are carried out by selecting the word line WL. In a reading operation, the bit lines BL and $\overline{BL}$ are previously precharged by making a precharge transistor PT conductive by a clock signal $\phi_P$. When the word line WL is selected, the potential of the bit line BL may or may not change depending on the state of the storage of charges in the memory cell CE connected to the bit line BL. Data is read by amplifying the voltage change of the bit line upon the selection by a sense amplifier SA. Refreshing is carried out by selecting the word line and effecting a read out operation.

Figure 8B:
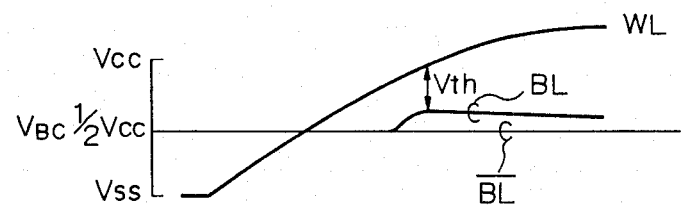
FIG. 8B, is a waveform diagram explaining the operation of the device shown in FIG. 8A.

In such a one-transistor one-capacitor type memory cell array, when the bit line BL is precharged to about ½Vcc, the cell transistor is turned ON only after the word line exceeds ½Vcc+Vth, so that changes flow from the cell to the bit line and the data "1" stored in the memory cell is transferred to the bit line BL, as shown in FIG. 8B. Then, the sense amplifier SA is activated to amplify the slight voltage difference between the bit lines BL and $\overline{BL}$.

The word line WL is formed by aluminum generally having a small electric resistivity. However, because of the increase in integration density of a memory cell array, the wiring width of a word line has become narrower and the wiring has inevitably become longer, so that the wiring resistance has become larger. If the word line is formed by polycrystalline silicon and so forth, having a higher resistivity than the Al wiring, the resistance is further increased. Moreover, the wiring resistance will vary depending on the manufacturing processes and so forth of a semiconductor memory device. Because of these factors, and considering the variations of the wiring resistances, the start of operation of the sense amplifier SA must be sufficiently delayed, to ensure that the start of a reading operation is delayed by the same amount. A conventional circuit for taking the timing margin is shown in FIG. 9, and the operation of the circuit shown in FIG. 9 will be explained with reference to FIG. 10, as follows.

During a reset, the bit line BL is precharged to ½Vcc by a precharge clock signal $\phi_P$. When a selection signal is input, the precharge clock signal $\phi_P$ falls and then the potential of the selected word line WL is raised at a time $t_0$ by a word decoder (not shown). At this time, the potential of the word line at a point near the decoder rises rapidly. The rise of the potential at a point of the word line WL0 far from the decoder, however, is delayed because the word line has a resistance with distributed constants. As described before, data is output from the memory cell CE only after the potential of the word line exceeds ½Vcc plus the threshold value Vth of the transfer gate transistor TR of the memory cell CE. When the transistor TR turns ON, the charges, stored at the storing node N1 of the memory cell CE in the circuit shown in FIG. 8A, flow out at the time t1, and thus the potential of the bit line BL rises slightly. Subsequently, an activating clock signal $\phi_L$ applied to the sense amplifier SA rises at a time t2 so that the potential difference between the bit lines BL and $\overline{BL}$ is amplified by a flip flop in the sense amplifier SA.

In the above description, the interval between the times t0 and t1 varies depending on the resistance of the word line, so that the time at which data flows to the bit line BL, varies in accordance with the variation in the manufacturing process. Accordingly, considering the variation of the resistance of the word line due to manufacturing variations, the time t2 at which the amplification by the flip flop in the sense amplifier SA begins is conventionally delayed with an estimated sufficient margin.

Figure 9:
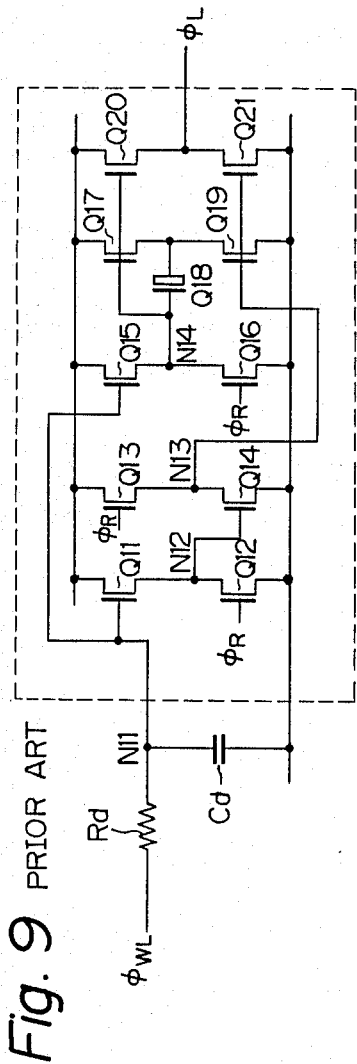
FIG. 9 is a circuit diagram showing a conventional timing circuit used in the device shown in FIG. 8A.
Figure 10:
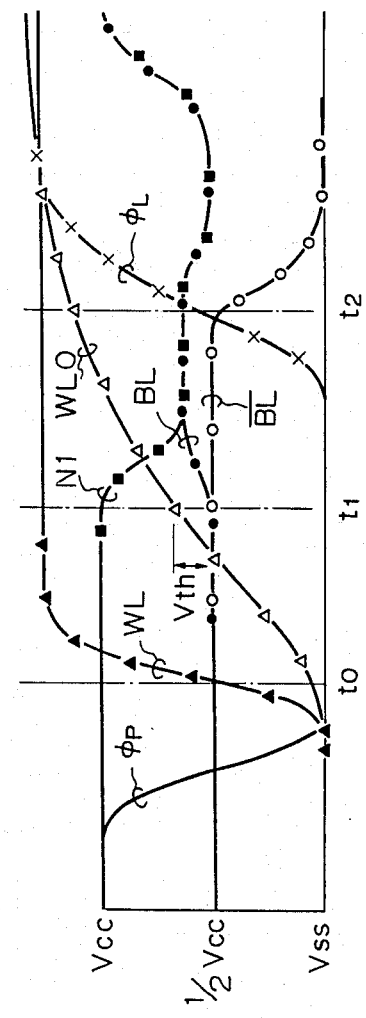
FIG. 10 is a waveform diagram explaining the operation of the conventional circuit shown in FIG. 9.

FIG. 9 shows a circuit for determining the times t0 through t2 of the sense amplifier SA. In FIG. 9, the margin between the times t0 through t2 can be determined by appropriately adjusting the time constant of the resistance Rd and the capacitance Cd to which the word line selecting signal $\phi_{WL}$ is input. Note that the circuit enclosed by a dash line is a dynamic amplifier circuit for generating a signal $\phi_L$ having a large driving capability, which is constructed by transistors Q11 through Q21. The output signal $\phi_L$ of the dynamic amplifier circuit is supplied as the clock signal $\phi_L$ to the sense amplifier SA.

As described above, in the conventional one-transistor one-capacitor type memory cell, it was necessary to delay the time of the start of operation of the sense amplifier in consideration of the delay of the signal transmission through the word line WL. The delay time must be estimated to be longer than the possible longest delay time, and thus the estimated delay time was determined by a time constant of only a C-R circuit. This estimated delay time, however, did not always coincide with the time at which the potential at a point on the word line farthest from the decoder exceeds ½Vcc+Vth. Usually, the estimated delay time was determined to be too long, to ensure a reliable operation. Thus, in the conventional circuit, too long a time was required for activating the sense amplifier SA.

Now, embodiments of the present invention will be described.

Figure 1:
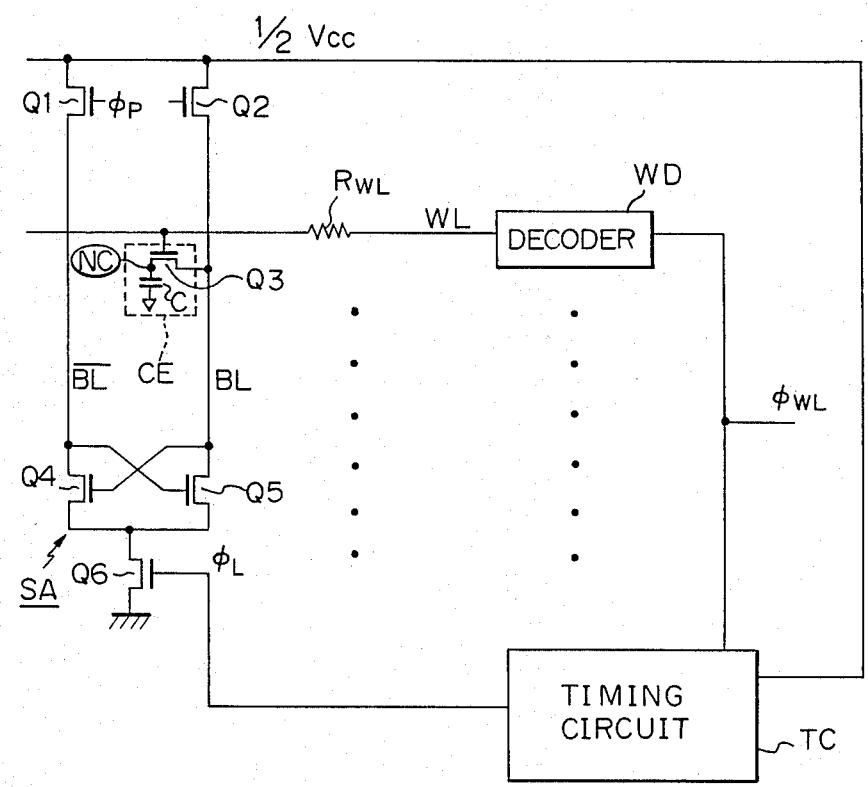
FIG. 1 is a circuit diagram showing a semiconductor memory device according to an embodiment of the present invention.

FIG. 1 shows an embodiment of the present invention, in which Q1 and Q2 are transistors for precharging bit lines and are turned ON or OFF by a precharge clock signal $\phi_P$. Q3 is a transistor for a word transfer gate of a memory cell CE, and C is a MOS capacitor. The memory cell CE is provided at each cross point between a word line WL and either one of a pair of bit lines BL and $\overline{BL}$. The word line WL is driven by a word decoder WD. A sense amplifier SA is connected at the ends of the bit lines BL and $\overline{BL}$. The sense amplifier SA has transistors Q4 and Q5 constructing a flip flop, and is activated by turning ON the transistor Q6 in response to an output signal $\phi_L$ from a timing circuit TC, as an embodiment of a detection circuit. A word line selecting signal $\phi_{WL}$ for driving the word decoder WD is input to the input of the timing circuit TC. Only a single word line WL and a single pair of bit lines are illustrated in FIG. 1, but, of course, a number of word lines and a number of pairs of bit lines are provided in practice.

Figure 2:
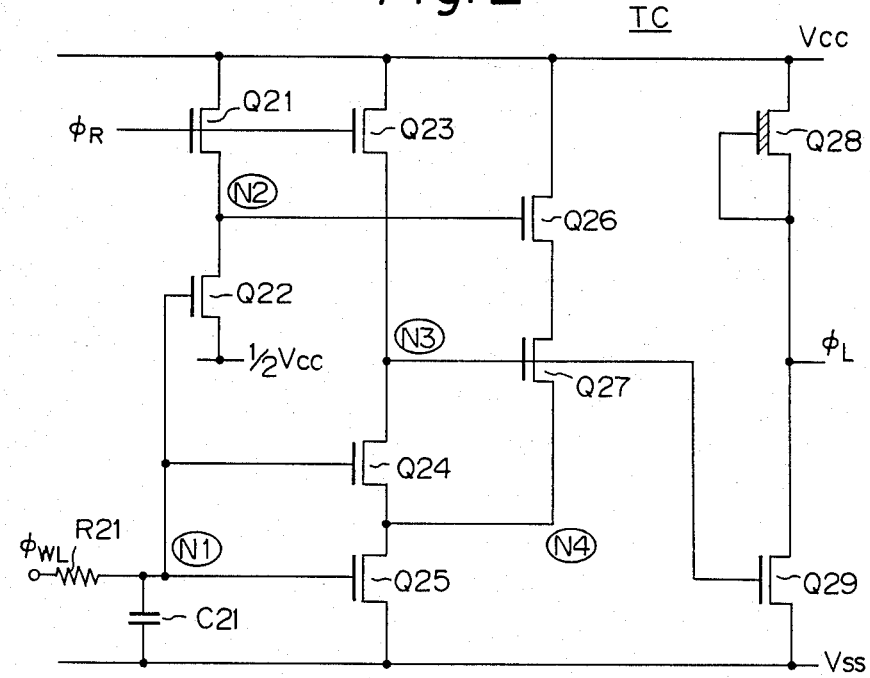
FIG. 2 is a circuit diagram showing an example of a timing circuit used in the device shown in FIG. 1.

FIG. 2 shows a circuit diagram of the timing circuit TC in the circuit shown in FIG. 1. The timing circuit TC in FIG. 2 has n-channel transistors Q21 through Q29 and a time constant circuit constructed by a resistor R21 and a capacitor C21. The resistor R21 and the capacitor C21 are so determined that the time constant circuit has the same delay time as the delay time of the actually connected word line WL. That is, the delay time of the time constant circuit is not the estimated delay time of the longest possible delay, but is substantially the same as the delay time of the actually connected word line WL. This delay time of the delay circuit is realized by, for example, providing the same wiring pattern as the word line. The delay time may, of course, be realized by a resistor element and a capacitor element having the same resistance and capacitance as the word line WL and also having similar resistance and capacitance dependencies on process fluctuations as the word line WL. It is well known that such a design technique will obtain a constant resistance or capacitance ratio among resistors or capacitors regardless of process variations, and accordingly, a detailed description thereof is omitted.

The time constant circuit is provided at the input portion of the timing circuit TC, and the input of the time constant circuit is connected to the output signal $\phi_{WL}$ of the word decoder. The output of the time constant circuit, that is, a node N1, is connected to the gate electrode of the transistor Q22. The timing circuit TC in the example shown in FIG. 2 is constructed by three driving circuits, i.e., a first stage driving circuit formed by the transistors Q21 and Q22 connected in series between a high voltage source Vcc and a precharge voltage source $\frac{1}{2}$Vcc, a second stage driving circuit formed by the transistors Q23, Q24 and Q25 connected in series between Vcc and a low voltage source Vss, and a final stage driving circuit formed by the transistors Q28 and Q29 connected in series between Vcc and Vss. The transistors Q26 and Q27 are connected in series between Vcc and a node N4, which is a connecting point between the source of the transistor Q24 and the drain of the transistor Q25; the gate of the transistor Q26 is connected to a node N2, which is a connecting point between the source of the transistor Q21 and the drain of the transistor Q22; and the gates of the transistors Q27 and Q29 are connected to a node N3, which is a connecting point between the source of the transistor Q23 and the drain of the transistor Q24. Thus, the transistors Q26 and Q27 form a positive feedback circuit. The output signal $\phi_L$ is obtained at a point between the source of the transistor Q28 and the drain of the transistor Q29.

The operation of the timing circuit shown in FIG. 2 is described as follows, with reference to FIG. 3.

Figure 3:
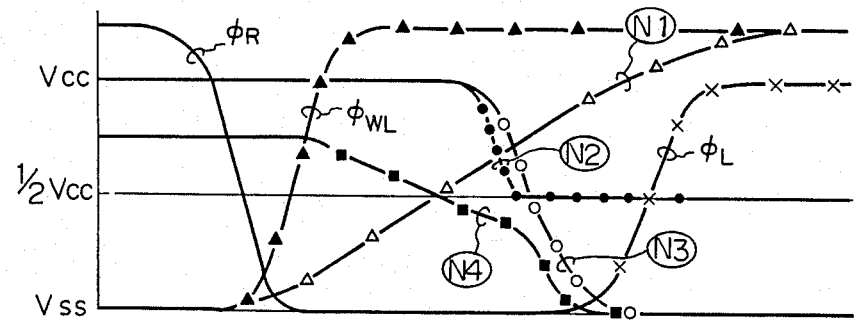
FIG. 3 is a waveform diagram explaining the operation of the timing circuit shown in FIG. 2.

Referring to FIGS. 2 and 3, during a reset period, the reset clock signal $\phi_R$ is at a level higher than Vcc so that the transistors Q21 and Q23 are in an ON state. Therefore, the nodes N2 and N3 are charged up to the Vcc level, and accordingly, the transistors Q26 and Q27 are in the ON state, so that the node N4 is pulled up to a high level near the power supply level Vcc.

Before driving the word line WL, the reset clock signal $\phi_R$ is pulled down to the Vss level so that the transistors Q21 and Q23 are turned OFF. The potentials at the nodes N2 and N3, however, remain at the Vcc level for a short time because charges remain at these nodes. During the rise of the clock signal $\phi_{WL}$ for driving the word decoder WD, the transistor Q22 remains in the OFF D state until the word line selecting signal $\phi_{WL}$ applied through the delay circuit to the gate of the transistor Q22 reaches $\frac{1}{2}$Vcc+Vth, where Vth is the threshold voltage of the transistor Q22. As long as the transistor Q22 is in the OFF state, the node N2 is at the high level Vcc so that the transistor Q26 remains in the ON state, and accordingly, the node N4 is charged up to a high level through the transistors Q26 and Q27. After the rise of the word line selecting signal $\phi_{WL}$, the potential at the node N1 gradually rises through the time constant circuit of R21 and C21. Even when a current begins to flow through the transistor Q25, because of the rise of the potential at the node N1, the potential at the node N4 is not suddenly lowered as long as the transistors Q22 and Q24 remain in the cut off state. The transistor Q22 turns ON only when the potential at the node N1 exceeds $\frac{1}{2}$Vcc+Vth, and the transistor Q24 turns ON only when the potential difference between the nodes N1 and N4 exceeds the threshold voltage Vth of the transistor Q24. Therefore, as long as the transistor Q24 is in the cut off state, the potential at the node N3 remains at the high level Vcc even when the potential at the node N4 is lowered to a certain extent.

When the potential at the node N1 exceeds $\frac{1}{2}$Vcc+Vth, the transistor Q22 is turned ON so that the potential at the node N2 is lowered to $\frac{1}{2}$Vcc. This decreases the current flowing through the transistor Q26, resulting in a lowering of the potential at the node N4. In response to the lowered potential at the node N4, the transistor Q24 is turned ON so that a current flows through the transistors Q24 and Q25. Thus, the potential at the node N3 is lowered to the low level Vss, or the low level "L", and in response to the lowered potential at the node N3, the transistor Q29 is turned OFF so that the output signal $\phi_L$ of the timing circuit TC becomes high level "H".

It should be noted that the node N1 is so designed that the potential at the node N1 is the same as the potential at a point on the word line WL, and the potential rise time at that point is the longest of any point on the word line. Usually, the point having the longest rise time is the point farthest from the word decoder WD. Therefore, the transistor Q22 detects the potential at the point on the word line WL, and the potential rise time at that point is the longest at any point on the word line. That is, the turning ON of the transistor Q22 is not determined by an estimated time as in the conventional circuit, but is determined by the potential level at the node N1.

Figure 4:
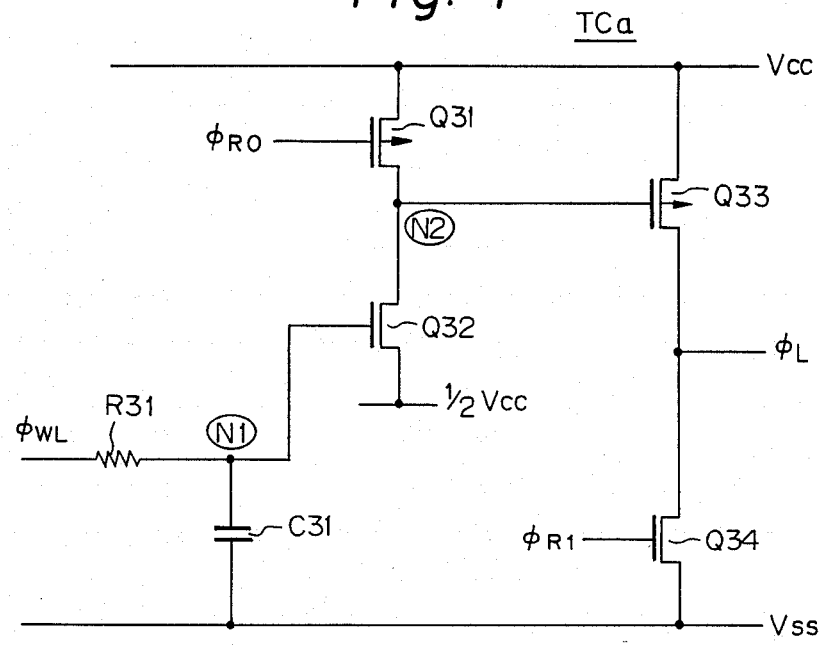
FIG. 4 is a circuit diagram showing another example of a timing circuit used in the device shown in FIG. 1.

In FIG. 4, a timing circuit $TC_a$ of another embodiment of the present invention is shown. In FIG. 4, The time constant circuit constructed by a resistor R31 and a capacitor C31 is the same as that of FIG. 2. The timing circuit $TC_a$ has p-channel MOS transistors Q31 and Q33 and n-channel MOS transistors Q32 and Q34. The transistors Q31 and Q32 are connected in series between the high voltage source Vcc and the precharge voltage source $\frac{1}{2}$Vcc, and the transistors Q33 and Q34 are connected between Vcc and Vss. The gate of the transistor Q31 receives a reset clock signal $\phi_{R0}$, and the gate of the transistor Q34 receives another clock signal $\phi_{R1}$. The gate of the transistor Q32 is connected to a node N1, which is the output of the time constant circuit of R31 and C31, and the gate of the transistor Q33 is connected to a node N2 between the drain of the p-channel transistor Q31 and the drain of the n-channel transistor Q32.

Figure 5:
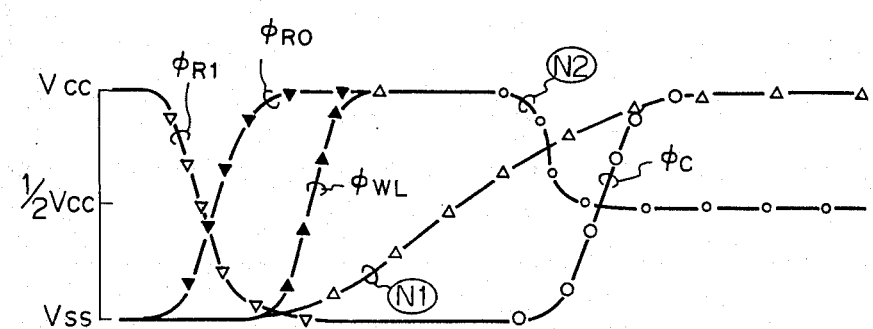
FIG. 5 is a waveform diagram explaining the operation of the circuit shown in FIG. 4.

The operation of the circuit shown in FIG. 4 will be described with reference to the waveforms shown in FIG. 5.

In a standby state, the reset clock signal $\phi_{R0}$ applied to the gate the transistor Q31 is Vss, and the o reset clock signal $\phi_{R1}$ at the gate of the output transistor Q34 is Vcc. Therefore, the transistor Q31 is in an ON state so that the node N2 is at the Vcc level, and accordingly, the p-channel transistor Q33 is in the OFF state. Since the transistor Q34 is ON, the output signal $\phi_L$ of the detecting circuit is at the "L" level, i.e., at the reset level Vss.

To switch the timing circuit $TC_a$ to an operating state, the reset clock signal $\phi_{R0}$ is raised to Vcc and the reset clock signal $\phi_{R1}$ is pulled down to Vss. Then the potential of the write clock signal $\phi_{WL}$ is raised to Vcc. This causes the potential at the node N1 to gradually rise with a delay by the time constant circuit including the resistor R31 and the capacitor C31. When the potential at the node N1 exceeds ½Vcc, the transistor Q32 is turned ON so that the node N2 falls from Vcc to ½Vcc. When the node N2 falls lower than Vcc−Vth, the p-channel transistor Q33 is turned ON. Since the reset clock signal $\phi_{R1}$ is at the Vss level at this time, the transistor Q34 is in the OFF state. Therefore, the output signal $\phi_L$ rises to the Vcc level to activate the sense amplifier SA.

The number of transistors is decreased in the timing circuit shown in FIG. 4 by employing p-channel transistors.

Next, as a further embodiment, instead of connecting the timing circuit to the word line selecting signal $\phi_{WL}$ as described above, an example is shown in FIG. 6 in which a detection circuit $TC_b$ is provided at the point of the word line WL farthest from one of the decoders. The detection circuit $TC_b$ includes transistors Q61, Q62 and Q63.

Figure 6:
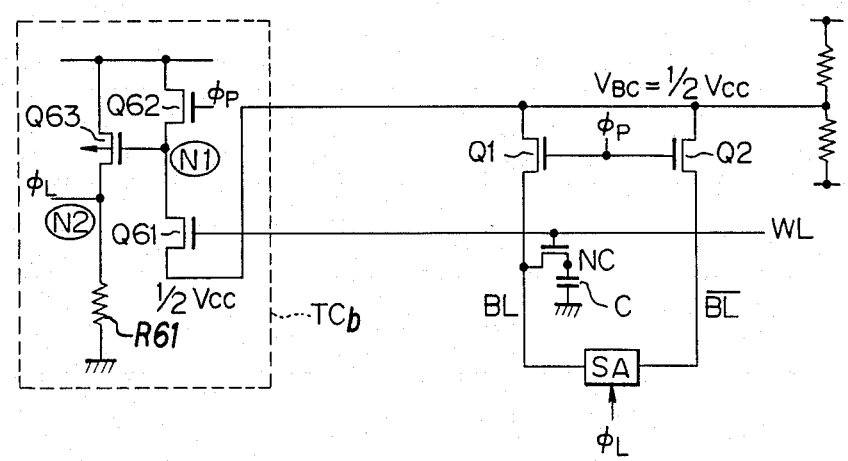
FIG. 6 is a circuit diagram showing a semiconductor memory device according to another embodiment of the present invention.

In FIG. 6, the timing circuit is not provided with a time constant circuit at the input thereof, but has the n-ch transistor Q61 having a gate directly connected to the word line WL, the source of the transistor Q61 being connected to the bit-line precharge voltage $V_{BC}=\frac{1}{2}Vcc$. The drain of the transistor Q62 is connected to a node N1. The transistor Q62 is connected between the high voltage source Vcc and the node N1, and the gate of the transistor Q62 receives the precharge clock signal $\phi_P$. The node N1 is connected to the gate of the p-channel transistor Q63, and the source of the transistor Q63 is connected to the power supply line Vcc. The drain of the transistor Q63 is connected through a resistor R61 to the ground, and an output signal $\phi_L$ is obtained at a node N2 connected to the drain of the transistor Q63.

Figure 7:
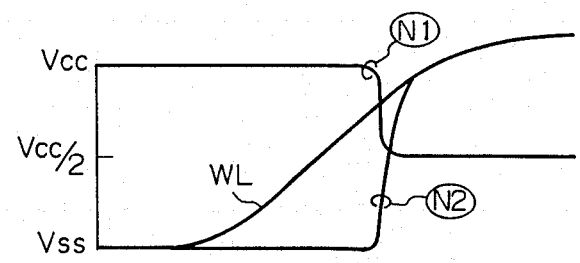
FIG. 7 is a waveform diagram explaining the operation of the device shown in FIG. 6.

The operation of the circuit shown in FIG. 6 is described with reference to FIG. 7, as follows.

When the end of the word line WL exceeds ½Vcc+Vth, the transistor Q61 turns ON so that the node N1 is lowered to ½Vcc, and thus the node N2 rapidly changes from Vss to Vcc. Therefore, the sense amplifier SA can be driven by the signal $\phi_L$ at the node N2. Note that, as the timing circuit $TC_b$, a circuit can be used which is the same as the circuit shown in FIG. 2 or in FIG. 4 except that the time constant circuit is omitted.

As described above, according to the present invention, since the word line potential is detected to activate the sense amplifier, it is not necessary to use an estimated time to take a time margin by considering the transmission variations of signals on the word line due to the word-line wiring resistance and other manufacturing variations, resulting in an improvement in the speed of a memory operation.

We claim:
1. A semiconductor memory device comprising:
a word line;
a pair of bit lines;
a one-transistor one-capacitor type memory cell connected between said word lines and one of said pair of bit lines;
a sense amplifier connected between said pair of bit lines;
a detection means for detecting that an electric potential, at one point in a plurality of points on said word line, exceeds a precharged potential of said bit line plus a threshold voltage of the transistor in said memory cell, the potential rise time at said point being the longest rise time on said word line of any of said plurality of points on said word line, and said sense amplifier being connected to said detection means and having an operation timing driven by a detection signal of said electric potential from said detection means.

2. A semiconductor memory device as set forth in claim 1, wherein said detection means comprises an input portion including a delay circuit, said delay circuit providing a delay time equal to a delay time of said word line from a word decoder to said point, an input of said delay circuit being connected to receive a clock signal for driving said word decoder.

3. A semiconductor memory device as set forth in claim 2, wherein said detection means further comprises driving circuit having an input connected to an output of said delay circuit, for driving said sense amplifier.

4. A semiconductor memory device as set forth in claim 3, wherein said driving circuit comprises a reset transistor and a driving transistor connected in series, said driving transistor having a gate electrode and two other electrodes, said gate electrode being connected to the output of said delay circuit, one of said two other electrodes being connected to receive said precharge potential, and another one of said two other electrodes being connected to an output node of said delay circuit, said detection signal being provided in response to a potential at said output node.

5. A semiconductor memory device as set forth in claim 4, wherein said reset transistor and said driving transistor in said driving circuit are N-channel MOS transistors.

6. A semiconductor memory device as set forth in claim 4, wherein said reset transistor is a P-channel MOS transistor and said driving transistor is an N-channel MOS transistor.

7. A semiconductor memory device as set forth in claim 1, wherein said detection means comprises a driving circuit having a reset transistor and a driving transistor connected in series, said driving transistor having a gate electrode and two other electrodes, said gate electrode being connected to a point farthest from a word decoder, one of said two other electrodes being connected to receive said precharge potential, and another one of said two other electrodes being connected to an output node, said detection signal being provided in response to a potential at said output node.

* * * * *

UNITED STATES PATENT AND TRADEMARK OFFICE
CERTIFICATE OF CORRECTION

PATENT NO. : 4,807,193

DATED : February 21, 1989

INVENTOR(S) : Yoshihiro TAKEMAE et al

It is certified that error appears in the above-identified patent and that said Letters Patent is hereby corrected as shown below:

On the cover page, Item [21], "81,559" should read --18,559--.

Signed and Sealed this

Thirty-first Day of October, 1989

Attest:

DONALD J. QUIGG

*Attesting Officer*   *Commissioner of Patents and Trademarks*